(12) United States Patent
Foucault

(10) Patent No.: US 10,318,856 B2
(45) Date of Patent: Jun. 11, 2019

(54) METHOD FOR THE MANUFACTURING OF DIELECTRIC BRIDGES FOR CONTACTLESS IDENTIFICATION

(71) Applicant: Jean Pierre Foucault, Paris (FR)

(72) Inventor: Jean Pierre Foucault, Paris (FR)

( * ) Notice: Subject to any disclaimer, the term of this patent is extended or adjusted under 35 U.S.C. 154(b) by 0 days.

(21) Appl. No.: 15/552,354

(22) PCT Filed: Feb. 22, 2016

(86) PCT No.: PCT/EP2016/053653
§ 371 (c)(1),
(2) Date: Sep. 25, 2017

(87) PCT Pub. No.: WO2016/131985
PCT Pub. Date: Aug. 25, 2016

(65) Prior Publication Data
US 2018/0032852 A1  Feb. 1, 2018

(30) Foreign Application Priority Data
Feb. 20, 2015  (FR) ..................... 15 00324

(51) Int. Cl.
*G06K 19/06* (2006.01)
*G06K 19/077* (2006.01)
*H01L 23/00* (2006.01)

(52) U.S. Cl.
CPC ... *G06K 19/07754* (2013.01); *G06K 19/0773* (2013.01); *G06K 19/07718* (2013.01); *H01L 24/75* (2013.01); *H01L 2224/81* (2013.01)

(58) Field of Classification Search
CPC ....... G06K 19/07754; G06K 19/07718; G06K 19/0773; H01L 24/75
(Continued)

(56) References Cited

U.S. PATENT DOCUMENTS

2003/0020107 A1* 1/2003 Bosco ............... H01L 21/31691
257/296
2004/0192011 A1 9/2004 Roesner

FOREIGN PATENT DOCUMENTS

EP   2 045 034 A1   4/2009
FR   2 795 203 A1   12/2000

OTHER PUBLICATIONS

International Search Report as issued in International Patent Application No. PCT/EP2016/053653, dated Jun. 23, 2016.

* cited by examiner

*Primary Examiner* — Karl D Frech
(74) *Attorney, Agent, or Firm* — Pillsbury Winthrop Shaw Pittman LLP

(57) ABSTRACT

A method produces non-contact dielectric bridges using a transfer machine for positioning an integrated circuit on a conductive circuit and a laser for ensuring the connection of the contacts thereof. The contacts of the integrated circuit that have been registered by a transfer machine in relation to the contacts of the conductive circuit, arranged on a continuous support made of heat- and radiation-resistant polyimide and held under pressure by the device, are welded together using a laser beam. The laser is positioned beneath the continuous support and built into the transfer machine. When the laser is used, the continuous support is immobilized by a stop and go device. The method is designed to increase the productivity of systems used to produce RFID tags, as a result of low investment costs and much faster speeds of connection of the contacts of the integrated circuit and the conductive circuit. The method allows the use of non-contact identification tags to become widespread over many professions.

13 Claims, 2 Drawing Sheets

Figure 1:
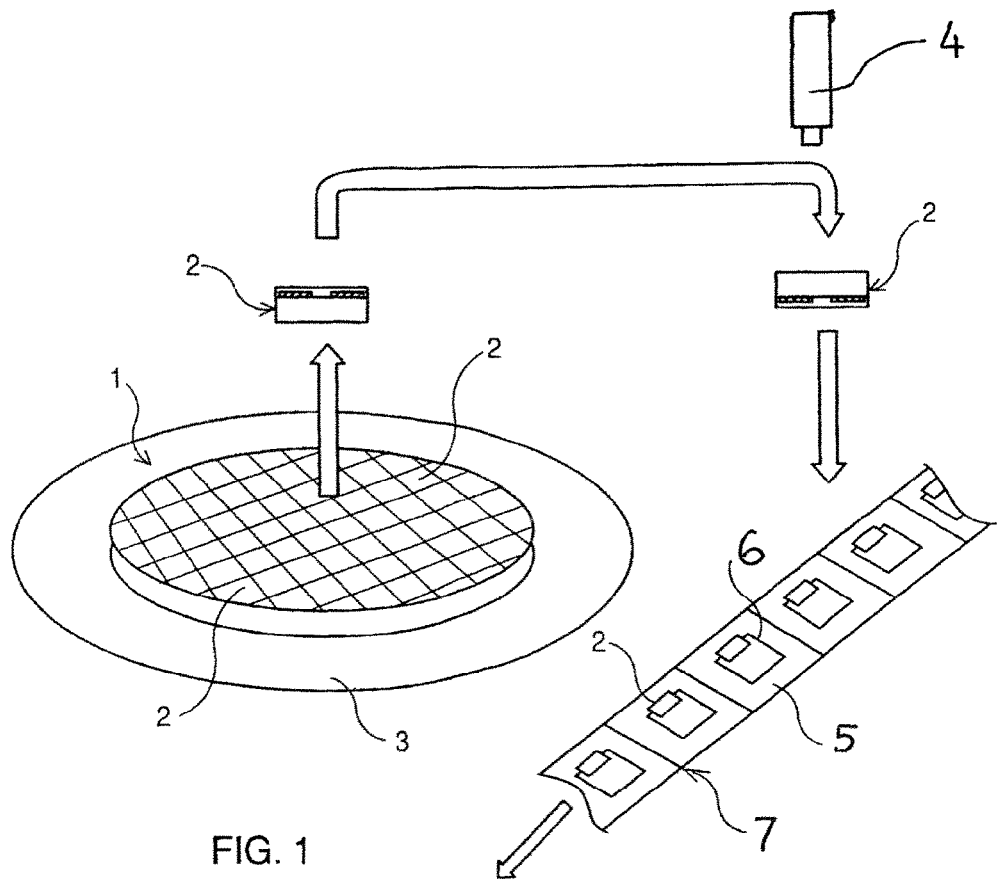

(58) Field of Classification Search
USPC .................................................. 235/492, 487
See application file for complete search history.

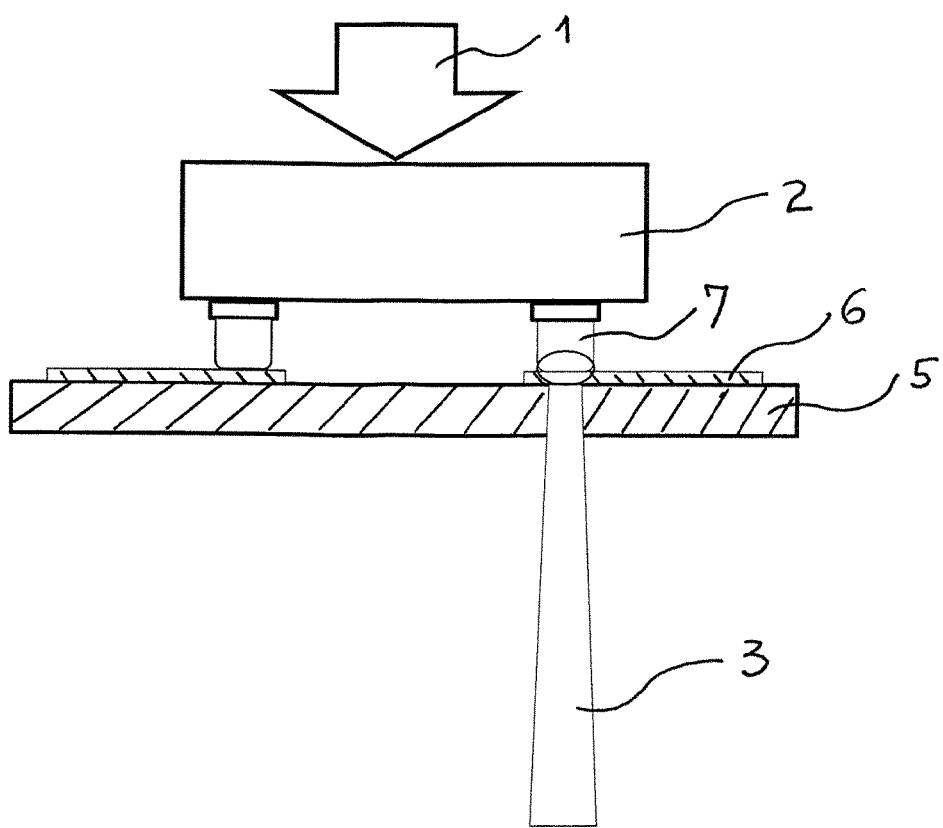

METHOD FOR THE MANUFACTURING OF DIELECTRIC BRIDGES FOR CONTACTLESS IDENTIFICATION

CROSS-REFERENCE TO RELATED APPLICATION

This is the U.S. National Stage of PCT/EP2016/053653, filed Feb. 22, 2016, which in turn claims priority to French Patent Application No. 1500324, filed Feb. 20, 2015, the entire contents of all applications are incorporated herein by reference in their entireties.

The invention concerns a method of manufacturing RFID labels or tags and the use of pick and place machines to implement such a manufacturing method.

RFID labels or tags are used in contactless radiofrequency identification of objects of very varied formats to replace barcodes. Contactless RFID labels or tags include firstly an integrated circuit or chip, and secondly a conductive circuit composed of an antenna on a dielectric medium. The antennae are generally made of copper or aluminum, but can be printed by printing processes such as screen printing, inkjet printing, flexography, etc. using special inks made from conductive components such as silver or copper. The antenna is connected to the integrated circuit through terminals called pads, for reception and transmission of radiofrequency signals between a remote reader and the integrated circuit.

The connection between the pads of the conductive circuit forming an antenna and the pads of the integrated circuit may be made using various methods. The two methods most commonly used are that of wire bonding and that of bumps.

In the wire bonding method the pads of the integrated circuit are connected to the pads of the conductive circuit (antenna) through connection wires, very often made of gold. Which requires, when connecting an integrated circuit to an antenna, a minimum of four microbonding operations. The assembly is protected by depositing a drop of non-conductive adhesive. The production rates using this method are very low due to the microbonding operations. The circuits produced are also thick due to the bonding method.

The second method, which is currently the more common of the two, uses "bumps" positioned at the four corners of the integrated circuit, which is square or rectangular in shape. The bumps are generally made of 99.9% pure gold. The connection is made after the circuit has been flipped over, using the "flip-chip" method, such that the bumps are positioned directly on the pads of the conductive circuit. A point of anisotropic adhesive applied before flipping makes a one-way electrical connection between the bumps of the integrated circuit and the pads of the antenna, and also protects the chip and the connections with an overall covering.

The tolerance of the positioning of the integrated circuits on the medium holding the conductive circuit according to this method is relatively low, and leads to a trade war between the manufacturers of positioning machines and the suppliers of integrated circuits, which in turn produces a technological race with regard to quality, and probably costly excessively high quality. It follows that the positioning tolerance varies from 30 µm, with positioning machine manufacturers, to 50 µm, with integrated circuit suppliers.

Since these are very small circuits, of the order of 400×400 µm, tolerance is very important, as the dimensions of the bumps are very small indeed, generally 60×60 µm.

The consequence of this situation is that the machines used for "flip-chip" assembly of integrated circuits on conductive circuits are relatively slow and expensive. The fastest nominal rates are of the order of 10,000 units per hour, but the actual rates are very often less than 8,000 parts per hour. To overcome this difficulty, machine manufacturers increase the number of assembly heads, but this strategy is pursued to the detriment of cost, and also of flexibility of use. These rates are very low compared to the rates obtained for the assembly of surface-mounted circuits (CMS).

The "flip-chip" method has the disadvantage that the integrated circuits require delicate handling (flipping and positioning) and must be positioned in compliance with the imposed tolerances, and also the disadvantage of the method of microbonding of the integrated circuits by anisotropic adhesive, which is expensive to use and takes a long time to dry, of the order of 100 msec, which then requires drying tunnels, which are expensive in terms of investment and operation, and also bulky.

Considering the above-mentioned prior art, a problem which the invention proposes to resolve is to implement a method for the manufacturing of RFID labels which resolves the above-mentioned disadvantages of the existing methods and which, in particular, allows high integrated circuit transfer rates by using machines with high manufacturing rates, with acceptable yields and budgets.

The first object of the proposed solution of the invention to this problem is a method for manufacturing RFID labels characterised by the fact that it includes steps of:

Supply of a silicon wafer containing standard integrated circuits such as they are supplied by various manufacturers, where the wafer is previously sawn before being installed in the positioning machine Picking of the integrated circuits using gripping means of a surface-mounted circuits pick and place machine Locating the positions of the integrated circuits before they are transferred to the conductive circuit using a camera and vision system Stopping the dielectric medium holding the antenna under the pick and place head Transfer of the picked integrated circuits to the dielectric medium, in compliance with the installation tolerances due to the prior location of the circuits Microbonding of the integrated circuit using an infrared or green laser, depending on the characteristics of the contact surfaces of the integrated circuit (chip) and of the antenna Its second object is the use of a pick and place machine with integrated circuit positioning tolerances between or equal to 30 and 50 µm, with a nominal rate of the order of 30,000 units per hour. Positioning in compliance with the tolerances is ensured on the dielectric medium by a special module integrated under the pick and place machine which, to position the integrated circuit, uses the location data provided by the assembler. To ensure faultless positioning, the coil of the dielectric medium holding the conductive circuit is then stopped and stationary, using a "stop and go" method, to enable the pipette of the assembler to deliver the integrated circuit in compliance with the tolerances, and to hold this circuit stationary, and pressed on the dielectric medium, during the laser microbonding operation. The belt of the dielectric medium restarts then once the laser microbonding is completed. The microbonding time is estimated at between 1 and 2 msec. No heat treatment is required during or after this operation. The latest developments of integrated circuit manufacturers involve enlarging the contact surfaces either by enlarging the surface of the pads of the electrical circuits by integrating the contact area, which plays a simple functional role of stabilising the chip, and which plays no role in connecting the integrated circuit or, on the contrary, by replacing the bumps of the integrated circuits by an enlarged contact area. Since the installation tolerances are broader, the speed of installation of the integrated circuits is increased thereby.

Its third object is the use of a laser to connect the integrated circuit to the conductive circuit. The laser is attached underneath the pick and place machine and integrated in a special module which enables the integrated circuit to be positioned on the dielectric medium in compliance with the tolerances at the same time as the integrated circuit removal pipette is held, applying a slight pressure of the order of one Newton. The laser is activated as soon as the integrated circuit is in position. As required by the circumstances, use is made of a laser with one head or several heads, or indeed of several lasers operating simultaneously, the heads of which are directed towards the contact surfaces.

Advantageously, the pick and place machine is a standard machine designed to install surface-mounted components. Since the integrated circuits are positioned in the wafer with their active faces upwards, they are flipped before being picked by means of the arm of the gripper pipette, before being positioned on the dielectric medium.

Its fourth object is the use of a laser operating in the range of infrared lasers such as, for example, a wavelength of the order of 1,064 nm. This range ensures a satisfactory connexion of the contact surfaces, if they are made of an alloy consisting of several materials.

Its fifth object is the use of a laser operating in the range of green lasers such as, for example, a wavelength of the order of 532 nm. This range ensures a satisfactory connection of contact surfaces made from non-ferrous metals such as copper or gold.

Its sixth object is the use of a medium made of a dielectric polyimide which is resistant to the effects of laser rays and heat such as, for example, Kapton®, supplied by the company DuPont®. In addition, to prevent the secondary effects of the laser radiation on the dielectric medium, this medium may, if required, be protected between the conductive circuit and the dielectric medium by an anti-reflection coating, with the aim of neutralising it and of controlling the rays when they return or are dispersed in an uncontrolled manner.

Its seventh object is the use of a dielectric bridge or "strap", enabling the manufacture of RFID labels or tags to be optimised using a standardised single format (standard JEDEC MO-283) of the conductive circuit which can be used for several frequency ranges (only the length and the format vary, whereas the pitch and tolerances remain identical), including the most common ones, such as HF (High Frequency: 13.56 MHz) and UHF (Ultra High Frequency: 966 to 915 MHZ, depending on the country). The electric bridge or strap can then be transferred easily and very rapidly, and attached with a standard conductive adhesive, due to the size of the surfaces in contact (of the order of 3×3 mm), for the manufacture of the RFID labels or tags with very different formats and specifications.

Figure 2:
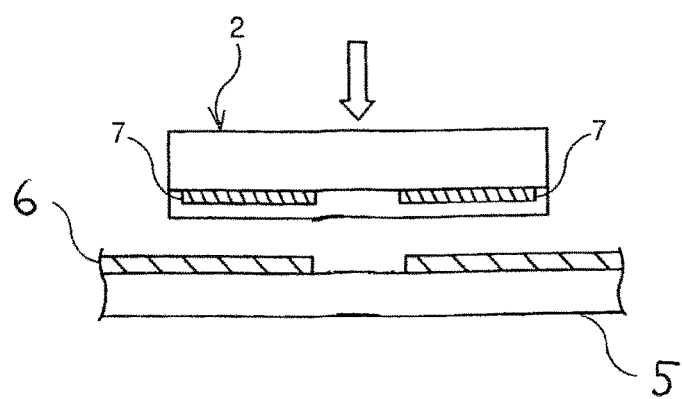

The invention will be better understood by reading the non-restrictive description which follows, written with regard to the appended illustrations, in which:

FIG. 1 illustrates a method of embodiment of the method of manufacture of RFID labels according to the invention FIG. 2 represents diagrammatically the transfer of an integrated circuit on a medium holding a conductive circuit forming an antenna for the manufacture of contactless dielectric media or straps according to the invention FIG. 3 illustrates the operation of the laser during the operation to attach the integrated circuit on to the conductive circuit.

The RFID labels or tags according to the invention have very diverse formats, and meet very specific standards such as, for example, standard ISO 18000-3 in the case of HF ("High Frequency") circuits, with a frequency of 13.56 MHz, and standard ISO 18000-6 in the case of UHF ("Ultra High Frequency") circuits, with an operating frequency ranging from 866 to 915 MHz. These labels have an integrated circuit and a medium consisting of a conductive circuit forming an antenna. The integrated circuit or chip takes the form of a parallelepiped roughly one hundred microns thick. As an example, the most recent chip from NXP, UCODE, 7 is 120 µm thick (±15 µm). The sides measure approximately 400 µm. The active face of the chip contains four bumps which make the connections. In the case of the NXP UCODE 7, the 99.9% gold bumps are 25 µm high, and measure 60×60 µm. Gold bumps are of very effective in making the connection by bonding with the pads of the copper conductive circuit. This is an excellent possibility, provided by the use of a green laser, the absorption coefficient of which is excellent. To prevent the secondary effects due to the use of green lasers it is proposed to replace the substrate commonly used in industry, namely PET, by a material which is roughly identical in terms of its dielectric characteristics, but which is resistant to high temperatures, a polyimide such as Kapton®, supplied by the company DuPont®. The stages of the manufacture of RFID labels or tags according to the invention are illustrated in particular in FIG. 1.

As can be seen in this figure, for the manufacture of RFID labels a silicon wafer 1 is first provided. This wafer contains a series of integrated circuits 2 separated from one another by a prior stage of sawing, such that they can be picked by means of a gripping instrument of an integrated circuit pick and place machine. Wafer 1, on which the integrated circuits are positioned with their active faces facing upwards, lies on a medium 3 which holds the integrated circuits in place. Defective integrated circuits are identified, usually by marking, or are identified in a wafer map associated with the wafer, so as to eliminate defective circuits from the process. A gripping system enables the integrated circuits to be picked one by one at high speed, and to be moved after they have been flipped. The positioning of these circuits is located one by one by vision system 4.

In another stage of the method according to the invention, medium 5 made of a polyimide such as Kapton™ from the company DuPont® is supplied, on which conductive circuits 6, the pads of which will make a connection to the bumps or pads of the integrated circuit by laser, are positioned regularly. In practice, for the manufacture of RFID labels, media 5 are supplied in strips 7 which will subsequently be divided.

Finally the pick and place machine is provided. This machine contains at least one arm with a pipette which forms a means for gripping the integrated circuits. The gripping means enable an integrated circuit to be picked, flipped and transferred to polyimide medium 5.

The picked and flipped integrated circuits are moved one by one to a point above the conductive circuit forming the antenna and then placed between the pads of the conductive circuit. During this operation the positioning of the integrated circuit is located by vision system 4.

The placing stage is more specifically represented diagrammatically in FIG. 2. As can be seen in this figure, to place it, integrated circuit 2, which has pads 7, is moved to a point above medium 5 holding antenna 6. Positioning integrated circuit 2 in compliance with the installation tolerances is undertaken by lateral and/or longitudinal movement of medium 5, by the special module integrated into the pick and place machine, using the location data communicated by vision system 4.

As is illustrated in FIG. 3, the positioning of the integrated circuit relative to the conductive circuit is kept unchanged by appropriate pressure, of the order of one Newton, applied to the integrated circuit through gripper pipette 1 of the pick and place machine directly on to conductive circuit 6.

The integrated circuit is connected to the conductive circuit forming the antenna by one or more laser beams 3, depending on the configuration of the RFID labels. The laser beam traverses the medium, made of a polyimide such as Kapton™ from the company DuPont®, in order to bond, with the heat released, the pad of conductive circuit 6 to bump 7 of the integrated circuit.

The laser beam effects the microbonding with a speed of the order of one to two milliseconds, whereas the drying time of the anisotropic adhesives in the prior art is of the order of 100 milliseconds. It is associated with lower machine purchase costs and identical personnel requirements. This leads to a very great optimisation of the RFID label production costs when using the method of the invention.

The use of standard dielectric bridges, or straps, with connection pads, where these connection pads then make a connection to RFID labels contact surfaces of very varied formats and sizes, allows very rational manufacturing on a processing machine, in order to meet very varied requirements in terms of frequency (UHF or HF), for small, medium or large series, and for particular media to satisfy specific usage constraints, special or standard formats, etc.

The manufacturing method according to the invention will allow very widespread use of RFID labels or tags, at affordable prices, for very varied requirements.

The invention claimed is:

1. A method for the manufacturing of dielectric bridges, or straps, for contactless identification, with a standardised pitch and with a broadened tolerance, or of contactless labels, or tags, of small width, the method comprising:
    providing a standard silicon wafer with integrated circuits with an active face facing upwards, previously prepared by sawing, for a laser connection of contact pads of said circuits to contact pads of conductive circuits forming an antenna on a surface of a dielectric medium made of a polyimide, which is resistant to heat and to rays emitted by lasers;
    picking the integrated circuits using a gripping system of an integrated circuit pick and place machine which flips the integrated circuits over;
    inputting integrated circuit positioning data using a camera and a vision system for location;
    placing the picked integrated circuits on to the dielectric medium made of polyimide, such that bumps of the integrated circuits are positioned facing the contact pads of the conductive circuits forming an antenna, held in place by a slight contact pressure of the bumps of the integrated circuits on the contact pads of the conductive circuit, wherein a strip of dielectric medium is immobilised during the placing;
    connecting the integrated circuit with the conductive circuit using a laser with one head and one or more beams, or with several heads, depending on a configuration and a size of the bumps, and
    advancing one pitch of the dielectric strip to undertake a next operation.

2. The method according to claim 1, wherein the bumps of the integrated circuit and of the conductive circuit are connected by an infrared frequency laser with one or more heads.

3. The method according to claim 2, wherein the bumps of the integrated circuit and of the conductive circuit are connected by an infrared frequency laser with one or more heads when a composition of connection surfaces is made of an alloy consisting of several metals.

4. The method according to claim 1, wherein the bumps of the integrated circuit and of the conductive circuit are connected by a green frequency laser with one or more heads.

5. The method according to claim 4, wherein the bumps of the integrated circuit and of the conductive circuit are connected by a green frequency laser with one or more heads when a composition of connection surfaces is made of non-ferrous metals.

6. The method according to claim 1, wherein the conductive circuits forming an antenna are positioned on a strip made of polymide which is resistant to heat and to the laser beams.

7. The method according to claim 1, wherein the conductive circuits forming an antenna positioned on a strip made of polymide are protected by an anti-reflective coating, which depends on the frequency and power of the laser used.

8. The method according to claim 1, wherein the integrated circuits are placed on the conductive circuit forming an antenna with positioning tolerances equal to or less than 50 μm.

9. The method according to claim 1, wherein the integrated circuits are placed on the conductive circuit forming an antenna at a nominal rate of 30,000 units per hour.

10. The method according to claim 1, wherein that the pick and place machine is a standard machine designed for installing surface components.

11. The method according to claim 1, wherein a special module is integrated in the pick and place machine, under the machine, operation of which is closely coordinated with the pick and place machine and its vision system.

12. The method according to claim 1, wherein the conductive circuits forming an antenna are small.

13. The method according to claim 12, wherein the conductive circuits forming an antenna are small are standardised according to standard JEDEC MO-283.

* * * * *